United States Patent [19]

Kotowski et al.

[11] Patent Number: 5,079,456
[45] Date of Patent: Jan. 7, 1992

[54] CURRENT MONITORING AND/OR REGULATION FOR SENSE FET'S

[75] Inventors: Jeffrey P. Kotowski, Rolling Meadows; Brian Chapman, Gurnee, both of Ill.; Kevin M. Andrews, Kenosha, Wis.

[73] Assignee: Motorola, Inc., Schaumburg, Ill.

[21] Appl. No.: 608,938

[22] Filed: Nov. 5, 1990

[51] Int. Cl.⁵ .................... H03K 17/18; H03K 17/687
[52] U.S. Cl. .................. 307/571; 307/296.8; 307/304; 307/491; 307/494; 307/568
[58] Field of Search ............... 307/304, 571, 350, 362, 307/359, 491, 494, 568, 573, 296.4, 296.5, 296.8; 323/273, 274, 269; 361/93, 86, 87

[56] References Cited

U.S. PATENT DOCUMENTS

| | | | |
|---|---|---|---|
| 4,667,121 | 5/1987 | Fay et al. | 307/304 |
| 4,675,561 | 6/1987 | Bowers | 307/304 |
| 4,952,827 | 8/1990 | Leipold et al. | 307/571 |
| 5,032,745 | 7/1991 | Izadinia et al. | 307/571 |

Primary Examiner—John Zazworsky
Attorney, Agent, or Firm—John H. Moore

[57] ABSTRACT

A method and apparatus is disclosed for measuring and/or controlling the level of current in a Sense FET which includes a power transistor (M1) and a sense transistor (M2). The transistors (M1) and (M2) are both biased to operate in a linear mode, and the Vds of the sense transistor (M2) is compared to a predetermined fraction of the Vds of the power transistor (M1). A control signal is generated that is representative of the results of the comparison, and, in one embodiment, that control signal is used in a feedback arrangement to drive the Vds of the sense transistor (M2) to the predetermined fraction of the Vds of the power transistor (M1). Consequently, the level of current carried by the sense transistor (M2) is caused to be equal to the same predetermined fraction of the current carried by the power transistor (M1).

11 Claims, 2 Drawing Sheets

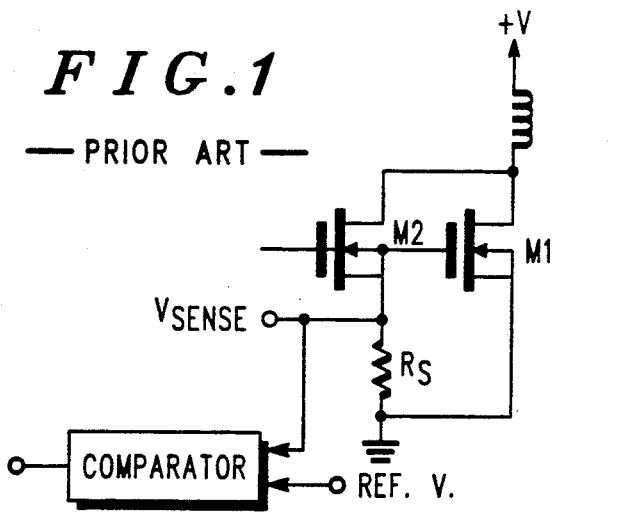
FIG.1 —PRIOR ART—
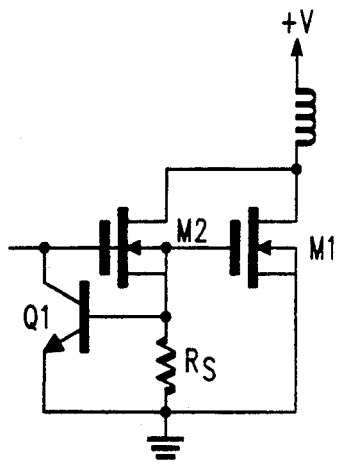
FIG.2 —PRIOR ART—
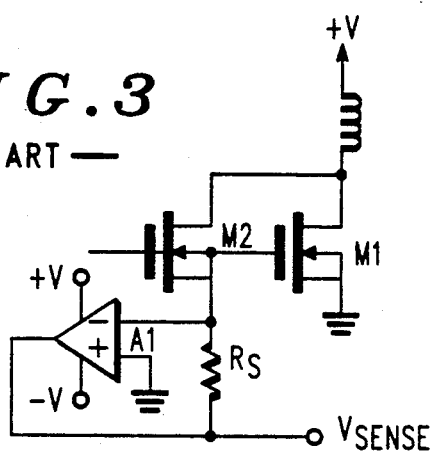
FIG.3 —PRIOR ART—
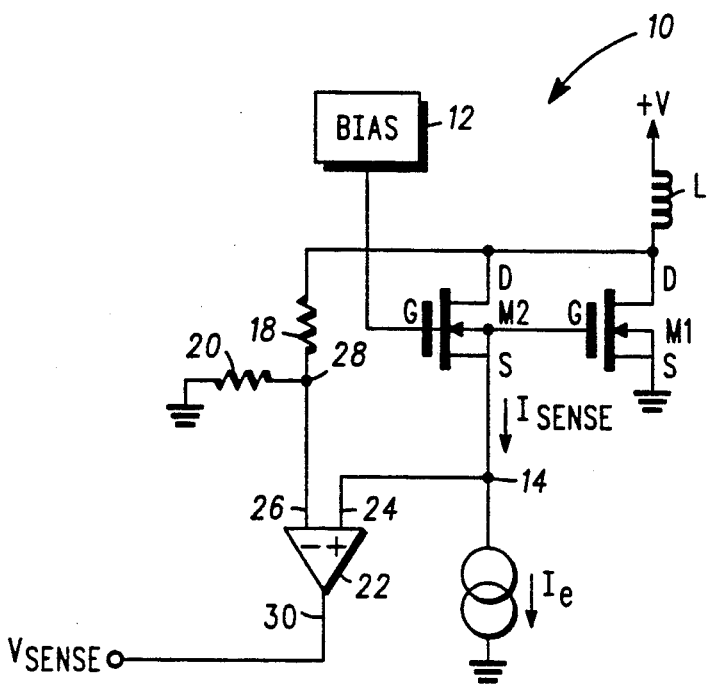
FIG.4

CURRENT MONITORING AND/OR REGULATION FOR SENSE FET'S

FIELD OF THE INVENTION

This invention is directed generally toward Sense FET's, and particularly to methods and apparatus for monitoring and/or controlling the value of current conducted by a Sense FET.

BACKGROUND OF THE INVENTION

As used herein, the term "Sense FET" means a semiconductor device comprised of two FET's (field effect transistors) in a single package, wherein one of the FET's (the smaller one) is designed to carry a predetermined percentage of the current carried by the other (larger) FET. If M1 refers to the larger FET and M2 refers to the smaller FET, then the current carried by M2 ($IM_2$) can be described by the following equation:

*Equation A:* $IM_2 = K_1 K_2 IM_1$ where $IM_1$ is the current carried by the larger FET M1, $K_1$ is the size ratio of M1 and M2, and $K_2$ is the ratio of the drain-to-source voltages (Vds) of M1 and M2.

In a typical application for a Sense FET, the larger FET M1 is used as a power device, and the smaller FET provides a source current that is measured and/or controlled in order to determine and/or control the level of current in the larger FET. FIGS. 1-3 show conventional approaches.

In FIG. 1, a sense resistor $R_s$ is coupled in series with the source current from M2, and the resultant voltage (Vsense) developed across $R_s$ is applied to one input of a comparator. A reference voltage is applied to the comparator's other input. Thus, when Vsense is equal to the reference voltage, the comparator develops an output signal which indicates that equality. A problem with this arrangement is that comparators typically have offsets of about 10 millivolts, thereby resulting in a relatively large error in the results of the comparison unless the offset is somehow compensated for.

In FIG. 2, a bipolar transistor Q1 is coupled across $R_s$ so as to limit the current in M1 and M2 when the voltage across $R_s$ is large enough to turn on Q1. A significant problem with this arrangement is that it consumes too much power. It can be seen that over two watts are dissipated when the value of $R_s$ is 0.2 ohms and 0.7 volts are required to turn on Q1.

In FIG. 3, an operational amplifier A1 senses the voltage across $R_s$, but this configuration requires dual power supplies for the operational amplifier.

OBJECTS OF THE INVENTION

It is a general object of the invention to provide an improved method and apparatus for measuring and/or controlling the current carried by a Sense FET.

It is a more specific objection of the invention to provide such a method and apparatus which is highly accurate and which does not dissipate relatively large amounts of power.

BRIEF DESCRIPTION OF THE FIGS.

FIGS. 1-3, previously discussed, show conventional arrangements for measuring and/or controlling the current carried by a Sense FET;

FIG. 4 shows an embodiment of the invention that provides an accurate measurement of current in a Sense FET;

DESCRIPTION OF THE PREFERRED EMBODIMENT

Referring now to FIG. 4, a circuit 10 is shown which measures the current carried by a Sense FET in accordance with the invention. In this embodiment, the Sense FET includes transistors M1 and M2, wherein M1 is an FET power transistor and M2 is an FET sense transistor. The transistor M1 has a drain electrode D that may be coupled to a load L, and a source electrode S that is grounded. The gate electrode of M1 is coupled to the gate electrode of M2, and both gates receive a bias voltage from bias circuitry 12.

Figure 6:
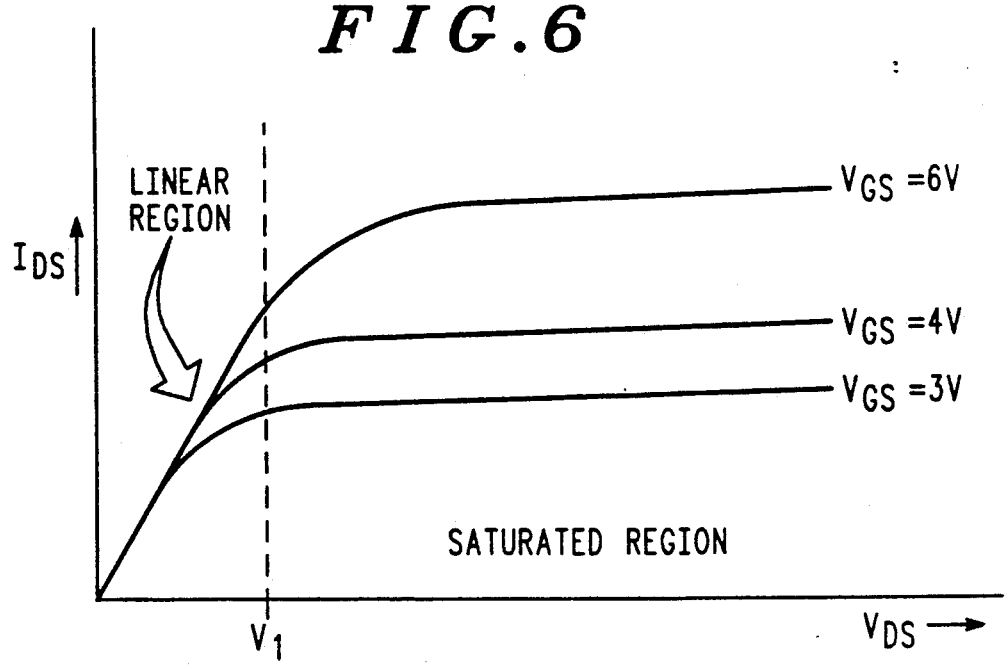
FIG. 6 shows characteristic curves for the type of FET shown herein.

Bias circuitry 12 may be any conventional circuitry that applies a voltage to the gate electrodes of transistors M1 and M2 so that both transistors operate in a linear mode. Referring briefly to FIG. 6, the linear region of operation is indicated as that region that is to the left of V1 (typically one volt or less) and it is in this linear region that the transistors M1 and M2 are biased to operate. This allows the circuitry of FIG. 4 to modify the Vds of transistor M2 for the purpose of changing the current carried by M2 so that it is a predetermined fraction of the current carried by the transistor M1.

Referring again to FIG. 4, the source electrode S of the transistor M2 is coupled to a node 14 which is itself coupled to a current source 16 which carries a current Ie. The magnitude of Ie is selected to be equal to the maximum value of source current to be conducted by the transistor M2. For example, if the transistor M1 is intended to conduct a maximum current of 1 ampere, and the current ratio between transistors M1 and M2 is 1000 to 1, then the current Ie is selected to be one milliampere.

The drain electrode (D) of the transistor M1 is coupled to the drain electrode of the transistor M2, and both drain electrodes are coupled to a voltage divider consisting of resistors 18 and 20.

A comparator 22 has a first input port 24 that is coupled to the node 14, a second input port 26 that is coupled to the junction (node 28) between resistors 18 and 20, and an output port 30 at which a signal Vsense is generated.

Generally, the circuit 10 operates as follows. With the transistors M1 and M2 both operating in a linear mode, the circuit 10 compares the Vds of the FET sense transistor M2 to a predetermined fraction of the Vds of the FET power transistor M1; when that comparison indicates substantial equality, an output signal Vsense is generated that is representative of the value of the current (Isense) conducted by the transistor M2. In the illustrated embodiment, the output signal Vsense is a binary signal which signifies whether the current conducted by the transistor M1 (Isense) is greater than or less than the current Ie.

More specifically, the resistors 18 and 20 provide a voltage that is a predetermined fraction of the Vds of the transistor M1, and the comparator 22 is coupled to those resistors and to the transistor M2 such that the voltage across the inputs of the amplifier 22 represents the difference between the Vds of transistor M2 and the predetermined fraction of the Vds of transistor M1. When the current Isense is less than Ie, the voltage at node 14 is relatively low, and the comparator's output Vsense is at a given binary level. When the current Isense increases to the point where it is equal to the current Ie, the resulting increase in voltage at the node 14 causes the comparator's output Vsense to change states. Because Ie is selected to be the maximum permitted value of Isense when the Vds of M2 is equal to the predetermined fraction of the Vds of M1, the change in the state of Vsense occurs when the Vds of M2 is substantially equal to the predetermined fraction of the Vds of M1. In practice, that predetermined fraction is preferably about ½ or larger.

Figure 5:
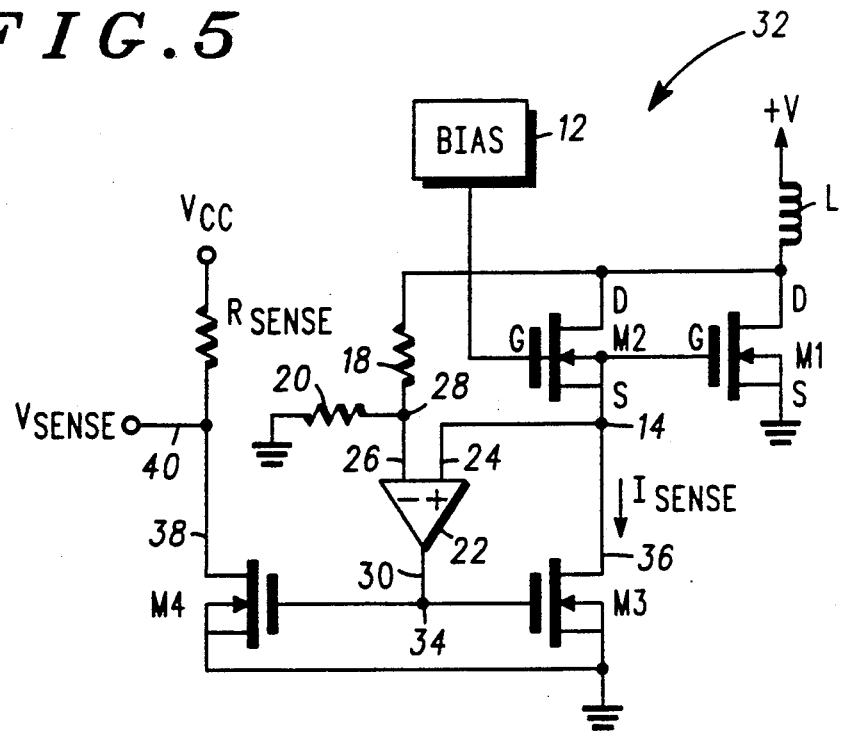
FIG. 5 shows another embodiment of the invention that both measures and controls the level of current in a Sense FET.

Referring now to FIG. 5, a circuit 32 is shown which not only measures or indicates the value of Isense, but also regulates the value of Isense. Components in FIGS. 4 and 5 that serve the same function have been given the same reference numbers.

As shown, the circuit 32 includes a Sense FET consisting of an FET power transistor M1 and an FET sense transistor M2. The gates of transistors M1 and M2 receive a voltage from bias circuitry 12 that causes both transistors to operate in a linear mode, as described previously.

A comparator 22 (which may be an operational amplifier with differential inputs) has a pair of input ports 24 and 26 and an output port 30. The input port 24 is coupled to a node 14 that is connected directly to the source electrode (S) of the transistor M2. The other input port 26 is coupled to a node 28 that is at the junction of resistors 18 and 20. As in the other embodiment, resistors 18 and 20 form a voltage divider that is coupled to the commonly-connected drain electrodes of transistors M1 and M2.

The circuit 32 also includes a current source that includes transistors M3 and M4. The gates of these two transistors are connected to each other and to a control input 34 which receives a control signal from the comparator 22. The drain of transistor M3 is coupled to an input branch 36 of the current mirror, while the drain of transistor M4 is coupled to an output branch 38 of the current mirror. A resistor Rsense is coupled in series with the output branch 38 so as to develop, at an output port 40, a voltage Vsense.

Generally, the current mirror functions conventionally insofar as it responds to the signal of its control input 34 by developing a current in the input branch 36, while a current of the same magnitude is "mirrored" or developed in the output branch 38.

With this arrangement, and with the transistors M1 and M2 operating in a linear mode, the comparator 22 essentially compares the Vds of the sense transistor M2 to a predetermined fraction $K_2$ (defined by the values of resistors 18 and 20) of the Vds of the power transistor M1. The output 30 of the comparator 22 is a control signal that is representative of the results of this comparison. The control signal is then used in a feedback arrangement with the current mirror to drive the Vds of the sense transistor M2 to the predetermined fraction $K_2$ of the value of the Vds of the power transistor M1. It can be seen from the relationship expressed in equation A above that this action regulates the value of the current conducted by the sense resistor M2 (Isense) to the same predetermined fraction of the current carried by the power transistor M1.

The foregoing effects are due to the fact that the comparator 22 acts like a differential amplifier in that it operates to reduce to zero the difference between the signals at its input ports 24 and 26. Any such difference that is sensed is an undesired deviation from the desired value of $K_2$ (see equation A), whereupon the comparator develops a control signal that changes the bias on the transistors M3 and M4 to vary the current in the current mirror's input branch 36 so as to drive the value of Vds of the sense transistor M2 to the desired fraction of Vds of the power transistor M1. When that condition is reached (which is the steady-state condition of the circuit 32), the magnitude of the current Isense bears the proper relationship to the current in the power transistor M1. The transistor M4 "mirrors" a current that is substantially equal to Isense in the current mirror's output branch 38. The resultant voltage drop across Rsense produces a voltage Vsense that is proportional to Isense.

From the foregoing description, it can be seen that the present invention provides a highly accurate technique for measuring and/or controlling the level of current in a Sense FET. Further, the measuring and/or control which is accomplished does not result in the excessive power dissipation that is typical of more conventional approaches.

Although the invention has been described in terms of preferred embodiments, it will be obvious to those skilled in the art that various modifications and alterations may be made without departing from the invention. Accordingly, it is intended that all such modifications and alterations be considered as within the spirit and scope of the invention as defined by the appended claims.

What is claimed is:

1. In a system having an FET power transistor and an FET sense transistor that are coupled together so that the magnitude of the current in the FET sense transistor (Isense) will be a fraction of the current in the FET power transistor, and wherein each FET transistor operates with its own drain-to-source voltage (Vds), a method for indicating the value of Isense, comprising:
   a) operating the FET power transistor and the FET sense transistor in a linear mode;
   b) comparing the Vds of the FET sense transistor to a predetermined fraction of the Vds of the FET power transistor; and
   c) when the comparison of step b) indicates substantial equality, generating an output signal that is representative of the value of Isense.

2. A method as set forth in claim 1 wherein the FET power transistor operates with a Vds of about one volt or less, and wherein said predetermined fraction is about 0.5.

3. A method as set forth in claim 1, further including:
   generating a control signal whose value is representative of the results of the comparison in step b); and
   using the control signal to regulate the Vds of the FET sense transistor.

4. A method as set forth in claim 3 wherein the Vds of the FET sense transistor is regulated to be said predetermined fraction of the Vds of the FET power transistor.

5. In a system having an FET power transistor and an FET sense transistor that are coupled together so that the current in the FET sense transistor (Isense) will be a fraction of the current in the FET power transistor (Iout), and wherein each FET transistor operates with its own drain-to-source voltage (Vds), a method of regulating the value of Isense, comprising:

a) operating the FET transistors in a linear mode;
b) comparing the Vds of the FET sense transistor to a predetermined fraction of the Vds of the FET power transistor;
c) generating a control signal that is representative of the results of the comparison effected in step b); and
d) using the control signal in a feedback arrangement so as to drive the Vds of the FET sense transistor to said predetermined fraction of the value of the Vds of the FET power transistor, thereby regulating the value of Isense to the same predetermined fraction of Iout.

6. In a system having an FET power transistor and an FET sense transistor that are coupled together so that the magnitude of the current in the FET sense transistor (Isense), will be a fraction of the current in the FET power transistor, and wherein each transistor operates with its own drain-to-source voltage (Vds), a circuit for monitoring the magnitude of Isense, comprising:

first means for biasing both transistors such that both transistors operate in a linear mode;
second means for comparing the Vds of the FET sense transistor to a predetermined fraction of the Vds of the FET power transistor, and for generating an output signal that is representative of the value of Isense when substantial equality exists between the Vds of the FET sense transistor and the predetermined fraction of the Vds of the FET power transistor.

7. A circuit as set forth in claim 6 wherein said second means includes:

a comparator having a first input, a second input, and an output;
means coupling a signal representative of the Vds of the FET sense transistor to the first input;
means coupling a signal representative of the predetermined fraction of the Vds of the FET power transistor to the second input, and wherein the comparator's output carries a signal representing the difference between the signals at the first and second inputs.

8. A circuit as set forth in claim 7, further including means receiving the signal from the comparator's output and being coupled to the FET sense transistor so as to regulate its Vds.

9. In a system having an FET power transistor and an FET sense transistor that are coupled together so that the magnitude of the current in the FET sense transistor (Isense) will be a fraction of the current in the FET power transistor, wherein each transistor has a source electrode, and wherein each transistor operates with its own drain-to-source voltage (Vds), a circuit for monitoring the magnitude of Isense, comprising:

means for biasing both transistors such that both transistors operate in a linear mode;

a comparator having a first input, a second input and an output;
means coupled to the FET power transistor for carrying to the comparator's first input a signal representing a predetermined fraction of the Vds of the FET power transistor;
a current source carrying a predetermined level of current and coupled between ground and the source electrode of the FET sense transistor;
means coupling the comparator's second input to the source electrode of the FET sense transistor,
whereby the signal at the comparator's output signifies whether the level of current conducted by the source electrode of the FET sense transistor is equal to the level of current carried by the current source.

10. In a system having an FET power transistor and an FET sense transistor that are coupled together so that the current in the FET sense transistor (Isense) will be a fraction of the current in the FET power transistor, and wherein each FET transistor has a source electrode and operates with its own drain-to-source voltage (Vds), a circuit for regulating the value of Isense, comprising:

first means for biasing both transistors such that both transistors operate in a linear mode;
second means coupled to the FET power transistor and to the FET sense transistor for sensing any difference between the Vds of the FET sense transistor and a predetermined fraction of the Vds of the FET power transistor, and for generating a control signal representative of the sensed difference;
a current mirror having an input branch, an output branch, and a control input, the input branch being coupled to the source electrode of FET sense transistor, the output branch carrying a current that is representative of the current carried by the input branch, and the control input receiving said control signal for regulating the current in the input branch,
whereby changes in the magnitude of the current in the current mirror's input branch in response to the control signal result in a change in the Vds of the FET sense transistor so as to drive the Vds of the FET sense transistor toward the predetermined fraction of the Vds of the FET power transistor.

11. A circuit as set forth in claim 10 wherein the sense transistor has a drain electrode, the power transistor has a drain electrode coupled to the sense transistor's drain electrode, and wherein the second means includes:

a comparator having first and second input ports and an output port, the first input port being coupled to the sense transistor's source electrode, the output port carrying the control signal; and
a voltage divider coupled between the drain electrode of the power transistor and the comparator's second input port.

* * * * *